US 6,940,132 B2

(12) United States Patent
Kikuchi

(10) Patent No.: US 6,940,132 B2
(45) Date of Patent: Sep. 6, 2005

(54) SEMICONDUCTOR DEVICE AND METHOD OF MANUFACTURING THE SAME

(75) Inventor: Kouji Kikuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 93 days.

(21) Appl. No.: 10/425,607

(22) Filed: Apr. 30, 2003

(65) Prior Publication Data

US 2004/0029332 A1 Feb. 12, 2004

Related U.S. Application Data

(63) Continuation of application No. PCT/JP01/09342, filed on Oct. 24, 2001.

(30) Foreign Application Priority Data

Oct. 30, 2000 (JP) ........................................ 2000-330778

(51) Int. Cl.$^7$ ............................................... H01L 29/76
(52) U.S. Cl. ...................... 257/364; 257/365; 438/283; 438/379
(58) Field of Search ................................. 257/364, 365; 438/283, 379

(56) References Cited

U.S. PATENT DOCUMENTS

| 5,241,212 | A |   | 8/1993 | Motonami et al. |
|---|---|---|---|---|
| 5,869,383 | A |   | 2/1999 | Chien et al. |
| 6,531,746 | B2 | * | 3/2003 | Kinoshita ................. 257/365 |
| 6,787,850 | B1 | * | 9/2004 | Pelloie ..................... 257/347 |
| 2003/0183884 | A1 | * | 10/2003 | Miyazawa ................. 257/401 |
| 2004/0161916 | A1 | * | 8/2004 | Kim ........................... 438/586 |

FOREIGN PATENT DOCUMENTS

| JP | 57-211766 | 12/1982 |
|---|---|---|
| JP | 63-166256 | 7/1988 |
| JP | 1-308060 | 12/1989 |
| JP | 6-5794 | 1/1994 |

OTHER PUBLICATIONS

Noriaki Matsuno, et al., A 500–mW High–Efficiency Si MOS MMIC Amplifier for 900–MHz–Band Use, IEEE Transactions on Microwave Theory and Techniques, vol. 48, No. 8, Aug. 2000, pp. 1407–1410.

* cited by examiner

Primary Examiner—Mary Wilczewski
Assistant Examiner—Toniae M. Thomas
(74) Attorney, Agent, or Firm—Oblon, Spivak, McClelland, Maier & Neustadt, P.C.

(57) ABSTRACT

A semiconductor device includes a semiconductor substrate having a first major surface and a second major surface, source and drain layers formed in the first major surface, a gate insulating film formed on the first major surface, a gate layer formed on the gate insulating film, a source electrode formed on the first major surface and electrically connected to the source layer, a drain electrode formed on the first major surface, electrically connected to the drain layer, and having a second isolation portion, a gate electrode formed on the first major surface, electrically connected to the gate layer, and having a first isolation portion, a first capacitance adjusting electrode formed on the gate insulating film and having a first capacitance adjusted by the first isolation portion, and a second capacitance adjusting electrode formed on the gate insulating film and having a second capacitance adjusted by the second isolation portion.

17 Claims, 10 Drawing Sheets

SEMICONDUCTOR DEVICE AND METHOD OF MANUFACTURING THE SAME

CROSS-REFERENCE TO RELATED APPLICATIONS

This is a Continuation Application of PCT Application No. PCT/JP01/09342, filed Oct. 24, 2001, which was not published under PCT Article 21(2) in English.

This application is based upon and claims the benefit of priority from the prior Japanese Patent Application No. 2000-330778, filed Oct. 30, 2000, the entire contents of which are incorporated herein by reference.

BACKGROUND OF THE INVENTION

1. Field of the Invention

The present invention relates to a semiconductor device and a method of manufacturing the same and, more particularly, to optimization in a capacitance component of a MOS transistor formed on a single pellet, e.g., an RF output transistor.

2. Description of the Related Art

Conventionally, along with the developments in lower-breakdown-voltage, higher-frequency devices, a semiconductor device such as an RF high-output MOSFET used in an RF amplifier circuit has been required for higher performance due to the scaling rule. Micropatterning for elements is thus required, which increases the effects of size variations, and the effect on capacitance components in the device.

FIG. 19 is a plan view showing a semiconductor device with a MOS transistor formed on a single pellet according to a prior art, FIG. 20 is a sectional view of the MOS transistor taken along the line of XX—XX, and FIG. 21 is a circuit diagram of the MOS transistor shown in FIG. 20.

As shown in FIGS. 19 and 20, n-type impurity diffusion regions are formed in the upper surface region of a p-type semiconductor substrate 1 formed from a silicon semiconductor or the like. A source region 2 and drain region 3 are formed in the respective n-type impurity diffusion regions to oppose each other. The source region 2 is electrically connected to a $p^+$-type impurity diffusion region 10 which is electrically connected to source electrodes (S) 8. The drain region 3 is contiguous to an $n^+$-type impurity diffusion region 11 which is electrically connected to a drain electrode (D) 9. A gate region 5 is formed above a region between the source region 2 and drain region 3 through a gate insulating film 4. The gate insulating film 4 and gate region 5 are covered with an insulating film 6 formed from a silicon oxide film or the like.

A gate electrode (G) 7 made of aluminum or the like and the drain electrode 9 made of aluminum or the like are formed on the insulating film 6. The source electrodes 8 made of aluminum of the like are formed on the lower surface of the semiconductor substrate 1 and a portion of an element region close to the gate region 5 on the major surface of the semiconductor substrate 1. The gate electrode 7 is not formed immediately above the gate region 5 arranged in the element region but is formed at a position two-dimensionally spaced apart from the gate region 5 on the upper surface of the semiconductor substrate 1. A gate bonding portion 12 which is made of aluminum or the like and connects to an external circuit is additionally formed on the gate electrode 7. The drain electrodes 9 are respectively formed on the drain region 3 arranged in the element region and along a two-dimensionally separated position on the upper surface of the semiconductor substrate 1. A drain bonding portion 13 which is made of aluminum or the like and connects to an external circuit is additionally formed on the drain electrode 9.

As shown in FIG. 21, parasitic capacitances C3 and C4 are formed in a MOS transistor formed in the semiconductor substrate 1 described above. The parasitic capacitances C3 and C4 are electrostatic capacitances generated between wirings or electrodes, which are inevitably generated in element formation.

In order to obtain a high output, the RF high-output MOS transistor requires matching circuits in input/output units. However, a capacitance component generated in a transistor varies according to the position or size of the wiring, electrode, or the like. This variation affects the matching circuits. As a result, a mismatch occurs in each matching circuit, and this makes it difficult to obtain a high output. To prevent this, an external capacitor is conventionally connected to the MOS transistor when necessary to adjust the above-described variation. However, formation of this capacitor requires a complicated manufacturing process, and accurate adjustment for the capacitance is difficult.

BRIEF SUMMARY OF THE INVENTION

That is, a semiconductor device according to a first aspect of the present invention comprises a first-conductivity-type semiconductor substrate having a first major surface and a second major surface opposing the first major surface, a second-conductivity-type source layer formed in a surface in the semiconductor substrate on a first major surface side, a second-conductivity-type drain layer formed in the surface in the semiconductor substrate on the first major surface side to oppose the source layer with a predetermined interval, a gate insulating film formed on the first major surface of the semiconductor substrate, a gate layer formed on the gate insulating film between the source layer and the drain layer, source electrodes formed on the first major surface of the semiconductor substrate and electrically connected to the source layer, a drain electrode formed on the first major surface of the semiconductor substrate, electrically connected to the drain layer, and having a second isolation portion, a gate electrode formed on the first major surface of the semiconductor substrate, electrically connected to the gate layer, and having a first isolation portion, a first capacitance adjusting electrode formed on the gate insulating film and having a first capacitance adjusted by the first isolation portion, and a second capacitance adjusting electrode formed on the gate insulating film and having a second capacitance adjusted by the second isolation portion.

A method of manufacturing a semiconductor device according to a second aspect of the present invention comprises forming a second-conductivity-type source layer and a second-conductivity-type drain layer, opposing the source layer with a predetermined interval, in a surface on a first major surface side in a semiconductor substrate, having a first major surface and a second major surface opposing the first major surface, forming a gate insulating film on the first major surface of the semiconductor substrate, forming a conductive film on the gate insulating film, patterning the conductive film and forming a gate layer and a capacitance adjusting electrode on the gate insulating film between the source layer and the drain layer, forming, on the first major surface of the semiconductor substrate, source electrodes electrically connected to the source layer, forming, on the first major surface of the semiconductor substrate, a drain electrode electrically connected to the drain layer, and forming, on the first major surface of the semiconductor substrate, a gate electrode electrically connected to the gate layer, wherein the gate electrode or the drain electrode extends on the capacitance adjusting electrode and is electrically connected to the capacitance adjusting electrode.

A method of manufacturing a semiconductor device according to a third aspect of the present invention comprises forming a second-conductivity-type source layer and a second-conductivity-type drain layer, opposing the source layer with a predetermined interval, in a surface on a first major surface side in a semiconductor substrate, having a first major surface and a second major surface opposing the first major surface, forming a gate insulating film on the first major surface of the semiconductor substrate, forming a conductive film on the gate insulating film, patterning the conductive film and forming a gate layer and first and second capacitance adjusting electrodes on the gate insulating film between the source layer and the drain layer, forming, on the first major surface of the semiconductor substrate, source electrodes electrically connected to the source layer, forming, on the first major surface of the semiconductor substrate, a drain electrode electrically connected to the drain layer, and forming, on the first major surface of the semiconductor substrate, a gate electrode electrically connected to the gate layer, wherein the gate electrode extends on the first capacitance adjusting electrode and is electrically connected to the first capacitance adjusting electrode, and the drain electrode extends on the second capacitance adjusting electrode and is electrically connected to the second capacitance adjusting electrode.

DETAILED DESCRIPTION OF THE INVENTION

Figure 1:
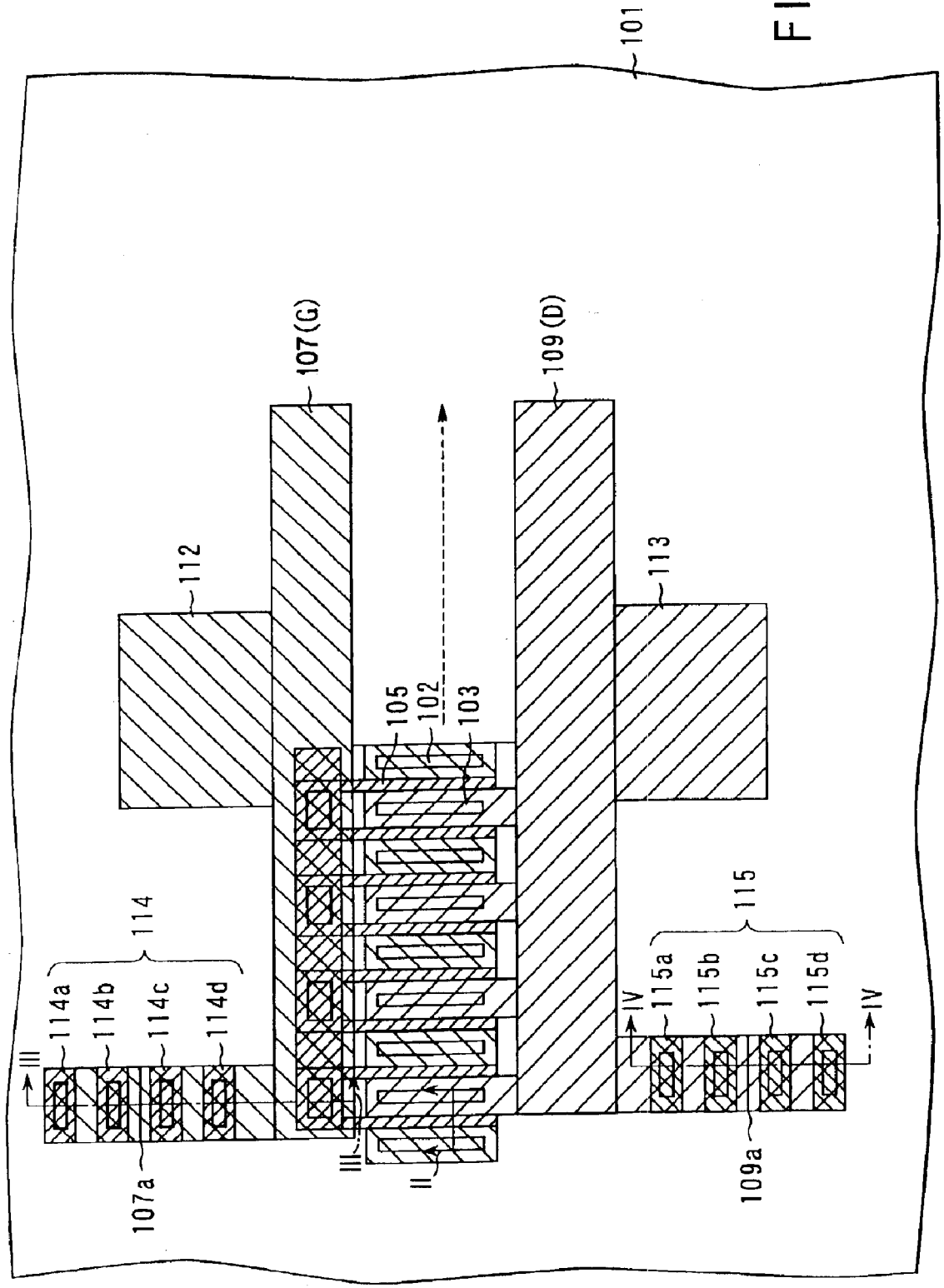
FIG. 1 is a plan view of a semiconductor device according to the first embodiment of the present invention.

A mode for carrying out the present invention will be described below with reference to the accompanying drawings. In this description, the same reference numerals in all the drawings denote the same parts.

[First Embodiment]

The first embodiment describes a semiconductor device in which source electrodes are formed on the upper and lower surfaces of a semiconductor substrate. This semiconductor device has capacitance adjusting electrodes.

Figure 2:
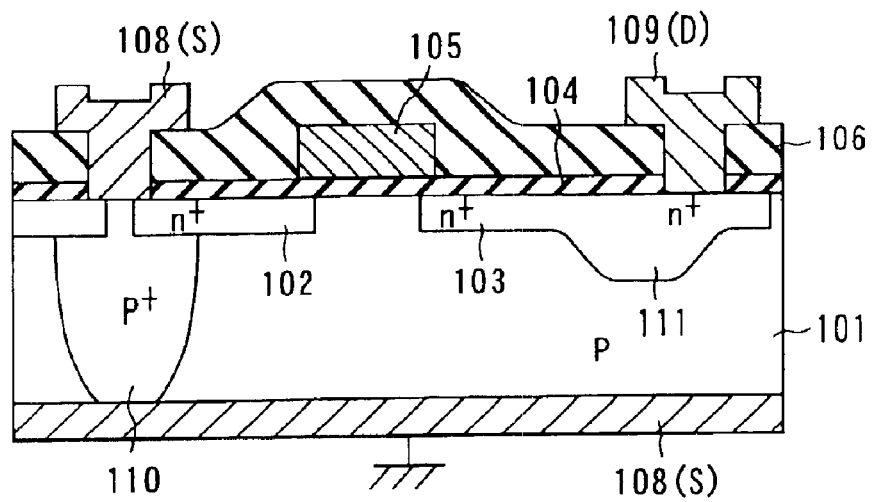
FIG. 2 is a sectional view of the semiconductor device taken along the line II—II in FIG. 1.
Figure 3:
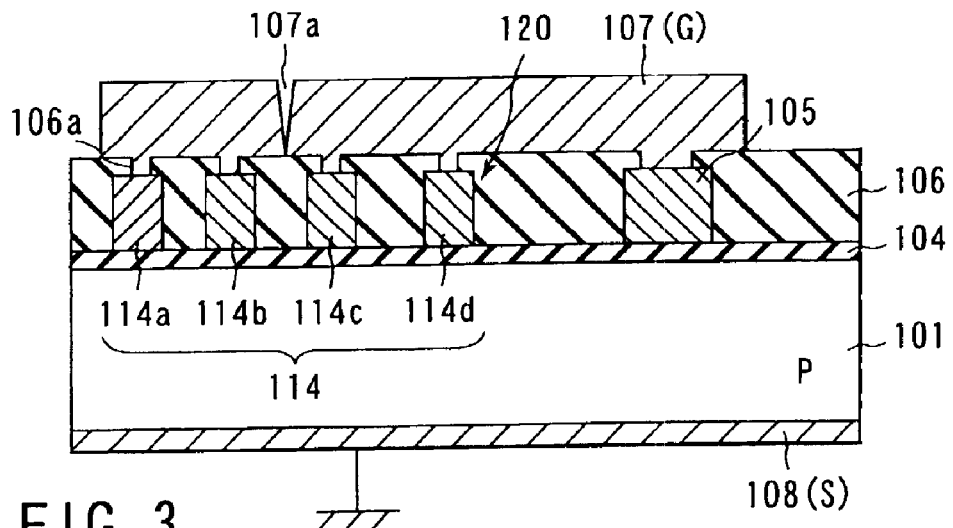
FIG. 3 is a sectional view of the semiconductor device taken along the line III—III in FIG. 1.
Figure 4:
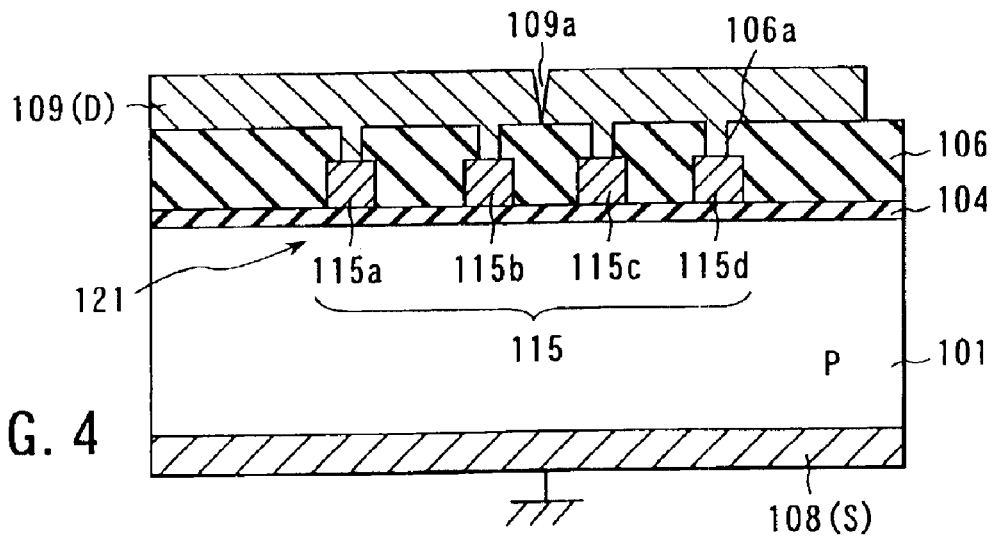
FIG. 4 is a sectional view of the semiconductor device taken along the line IV—IV in FIG. 1.
Figure 5:
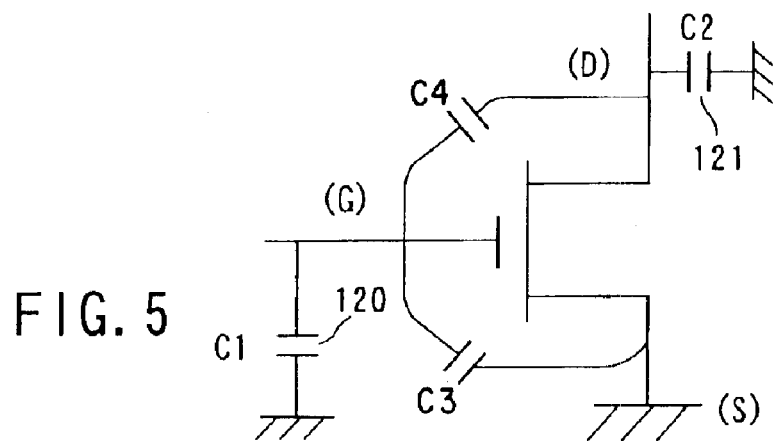
FIG. 5 is a circuit diagram showing a MOS transistor in the semiconductor device shown in FIG. 2.

FIG. 1 is a plan view of a semiconductor device according to the first embodiment of the present invention, FIG. 2 is a sectional view of the semiconductor device taken along the line II—II in FIG. 1, FIG. 3 is a sectional view of the semiconductor device taken along the line III—III in FIG. 1, FIG. 4 is a sectional view of the semiconductor device taken along the line IV—IV in FIG. 1, and FIG. 5 is a circuit diagram showing a MOS transistor in the semiconductor device shown in FIG. 2.

A basic structure of the semiconductor device according to the first embodiment of the present invention will be described with reference to FIGS. 1 and 2.

As shown in FIGS. 1 and 2, n-type impurity diffusion regions are formed in the upper surface region of a p-type semiconductor substrate 101 formed from a silicon semiconductor or the like. A source region 102 and drain region 103 are formed in the respective n-type impurity diffusion regions to oppose each other. In this case, the source region 102 is electrically connected to a $p^+$-type impurity diffusion region 110 while the drain region 103 is formed to be contiguous to an $n^+$-type impurity diffusion region 111. A gate region 105 made of, e.g., polysilicon is formed on a region between the source region 102 and drain region 103 through a gate insulating film 104 formed from, e.g., a silicon thermal oxide film. The gate insulating film 104 and gate region 105 are covered with an insulating film 106 formed from, e.g., a silicon oxide film.

A gate electrode (G) 107 made of, e.g., aluminum is formed on the insulating film 106. The gate electrode 107 is not formed immediately above the gate region 105 in a region (to be referred to as an element region, hereinafter) in which elements are formed, but is formed at a position two-dimensionally spaced apart from the element region on the upper surface of the semiconductor substrate 101. A gate bonding portion 112 for connecting to an external circuit is additionally formed on the gate electrode 107, which is made of, e.g., aluminum.

A source electrode (S) 108 made of, e.g., aluminum is formed on a region close to the gate region 105. The source electrode 108 is formed along the source region 102 formed in the element region, and is electrically connected to the $p^+$-type impurity diffusion region 110. Another source electrode 108 is formed on the lower surface of the semiconductor substrate 101 and is grounded.

Drain electrodes (D) 109 made of, e.g., aluminum are formed on the insulating film 106. The respective drain electrodes 109 are formed in a region close to the gate region 105 and at a position two-dimensionally spaced apart from the element region on the upper surface of the semiconductor substrate 101. The drain electrode 109 is formed along the drain region 103 formed in the element region and is electrically connected to the $n^+$-type impurity diffusion region 111. A drain bonding portion 113 for connecting to an external circuit is additionally formed on the drain electrode 109, which is made of, e.g., aluminum.

A structure as the characteristic feature of the semiconductor device according to the first embodiment of the present invention will be described with reference to FIGS. 1 and 3 to 5.

In the first embodiment of the present invention, a first capacitance adjusting electrode 114 close to the gate electrode 107 and a second capacitance adjusting electrode 115 close to the drain electrode 109 are formed on the gate insulating film 104. The first capacitance adjusting electrode 114 forms a first capacitor element 120 having a first capacitance C1. The second capacitance adjusting electrode 115 forms a second capacitor element 121 having a second capacitance C2. Capacitances C3 and C4 shown in FIG. 5 are parasitic capacitances. These first and second capacitance adjusting electrodes 114 and 115 will be described in detail below.

As shown in FIG. 3, the first capacitance adjusting electrode 114 is arranged on the gate insulating film 104 to be close to the gate region 105. The first capacitance adjusting electrode 114 is comprised of first to fourth electrodes 114a, 114b, 114c, and 114d. The first capacitor element 120 whose capacitance is adjusted is formed by forming an isolation portion 107a in the gate electrode 107. The first capacitor element 120 includes the gate insulating film 104, the source region 102 shown in FIG. 2, and the first capacitance adjusting electrode 114 comprised of the third and fourth electrodes 114c and 114d. The first capacitor element 120 is formed by the following method.

After various diffusion regions are formed in the upper surface region of the semiconductor substrate 101, the gate insulating film 104 is formed on the semiconductor substrate 101. A conductive film made of, e.g., polysilicon is formed on the gate insulating film 104. The conductive film is patterned to form the gate region 105 and the first capacitance adjusting electrode 114 comprised of the plurality of electrodes 114a, 114b, 114c, and 114d. The insulating film 106 is then formed on the gate region 105 and first capacitance adjusting electrode 114 and covers them. The insulating film 106 is partially removed to form each contact hole 106a which exposes a portion of the upper surface of the gate region 105 or first capacitance adjusting electrode 114. A film, e.g., an aluminum film is formed in the contact holes 106a and on the insulating film 106 and patterned to form the gate electrode 107. The gate region 105 and first capacitance adjusting electrode 114 are thus connected to the gate electrode 107 through the contact holes 106a.

In order to adjust the capacitance component of the transistor, the gate electrode 107 undergoes trimming using a laser beam or the like. This removes a portion of the gate electrode 107 from its upper surface to the upper surface of the insulating film 106, thereby forming the isolation portion 107a at the desired position of the gate electrode 107. Consequently, the first and second electrodes 114a and 114b of the plurality of first capacitance adjusting electrodes 114 are electrically isolated from the gate electrode 107. With this processing, the first capacitor element 120 including the gate insulating film 104, the source region 102, and the third and fourth electrodes 114c and 114d connected to the gate electrode 107 is formed.

As shown in FIG. 4, the second capacitance adjusting electrode 115 is arranged on the gate insulating film 104. The second capacitance adjusting electrode 115 is comprised of first to fourth electrodes 115a, 115b, 115c, and 115d. The second capacitor element 121 whose capacitance is adjusted is formed by forming an isolation portion 109a in the drain electrode 109. The second capacitor element 121 includes the gate insulating film 104, the drain region 103 shown in FIG. 2, and the second capacitance adjusting electrode 115 comprised of the first and second electrodes 115a and 115b. The second capacitor element 121 is formed by the following method.

After various diffusion regions are formed in the upper surface region of the semiconductor substrate 101, the gate insulating film 104 is formed on the semiconductor substrate 101, and a conductive film made of, e.g., polysilicon is formed on the gate insulating film 104. The conductive film is patterned to form the second capacitance adjusting electrode 115 comprised of the plurality of electrodes 115a, 115b, 115c, and 115d. Polysilicon used to form the second capacitance adjusting electrode 115 is the same material as that of the first capacitance adjusting electrode 114 and gate region 105. The insulating film 106 is then formed on the second capacitance adjusting electrode 115 and covers it. The insulating film 106 is partially removed to form each contact hole 106a which exposes a portion of the upper surface of the second capacitance adjusting electrode 115. A film, e.g., an aluminum film is formed in the contact holes 106a and on the insulating film 106 and patterned to form the drain electrode 109. The second capacitance adjusting electrode 115 is thus connected to the drain electrode 109 through the contact holes 106a.

In order to adjust the capacitance component of the transistor, the drain electrode 109 undergoes trimming using a laser beam or the like. This removes a portion of the drain electrode 109 from its upper surface to the upper surface of the insulating film 106, thereby forming the isolation portion 109a at the desired position of the drain electrode 109. Consequently, the third and fourth electrodes 115c and 115d of the plurality of second capacitance adjusting electrodes 115 are electrically isolated from the drain electrode 109. With this processing, the second capacitor element 121 including the gate insulating film 104, the drain region 103, and the first and second electrodes 115a and 115b connected to the drain electrode 109 is formed.

The capacitances of the first and second capacitor elements 120 and 121 may be adjusted by the thickness of the gate insulating film 104. In the first embodiment of the present invention, these capacitances are respectively adjusted by the number of first capacitance adjusting electrodes 114 electrically connected to the gate electrode 107 and the number of second capacitance adjusting electrodes 115 electrically connected to the drain electrode 109.

That is, the capacitance value of the first capacitor element 120 is determined depending on the contact area between the first capacitance adjusting electrode 114 and gate insulating film 104. Therefore, when the number of first capacitance adjusting electrodes 114 connected to the gate electrode 107 increases, the total contact area between the first capacitance adjusting electrodes 114 and gate insulating film 104 increases, thereby increasing the capacitance value of the first capacitor element 120.

Similarly, the capacitance value of the second capacitor element 121 is determined depending on the contact area between the second capacitance adjusting electrode 115 and gate insulating film 104. Therefore, as the number of second capacitance adjusting electrodes 115 connected to the drain electrode 109 increases, the total contact area between the second capacitance adjusting electrodes 115 and gate insulating film 104 increases, thereby increasing the capacitance value of the second capacitor element 121.

According to the first embodiment described above, the number of first capacitance adjusting electrodes 114 connected to the gate electrode 107 is changed by adjusting the position of the isolation portion 107a formed in the gate electrode 107, thereby changing the capacitance value C1 of the first capacitor element 120. Similarly, the number of second capacitance adjusting electrodes 115 connected to the drain electrode 109 is changed by adjusting the position of the isolation portion 109a formed in the drain electrode 109, thereby changing the capacitance value C2 of the second capacitor element 121.

In this manner, the first and second capacitor elements 120 and 121 having the respective capacitances C1 and C2 are formed, so that the capacitance component of the transistor can be easily adjusted to a predetermined value. This allows to accurately adjust the capacitances and avoid mismatches in matching circuits.

At the same time as formation of the gate region 105, the first and second capacitance adjusting electrodes 114 and 115 can be formed by using the same conductive film as that of the gate region 105. This makes it possible to form the first and second capacitor elements 120 and 121 without any complicated manufacturing process.

Note that the method of adjusting the capacitance of the capacitance adjusting electrode 114 or 115 is not limited to form the isolation portion 107a or 109a in the gate electrode 107 or drain electrode 109. For example, a pattern for the capacitance adjusting electrode 114 or 115 may be changed to change its area.

That is, when the size of each of the electrodes 114a, 114b, 114c, and 114d of the capacitance adjusting electrode 114 shown in FIG. 3 is to be changed, an increase in contact area between the gate insulating film 104 and the electrodes 114a, 114b, 114c, and 114d can increase the capacitance value of the first capacitor element 120 while a decrease in contact area can decrease the capacitance value of the first capacitor element 120.

Similarly, when the size of each of the electrodes 115a, 115b, 115c, and 115d of the capacitance adjusting electrode 115 shown in FIG. 4 is to be changed, an increase in contact area between the gate insulating film 104 and the electrodes 115a, 115b, 115c, and 115d can increase the capacitance value of the second capacitor element 121 while a decrease in contact area can decrease the capacitance value of the second capacitor element 121.

When a pattern for the capacitance adjusting electrode 114 or 115 is to be changed to change its area, the capacitance adjusting electrode 114 or 115 need not be separated into a plurality of electrodes.

Figure 6:
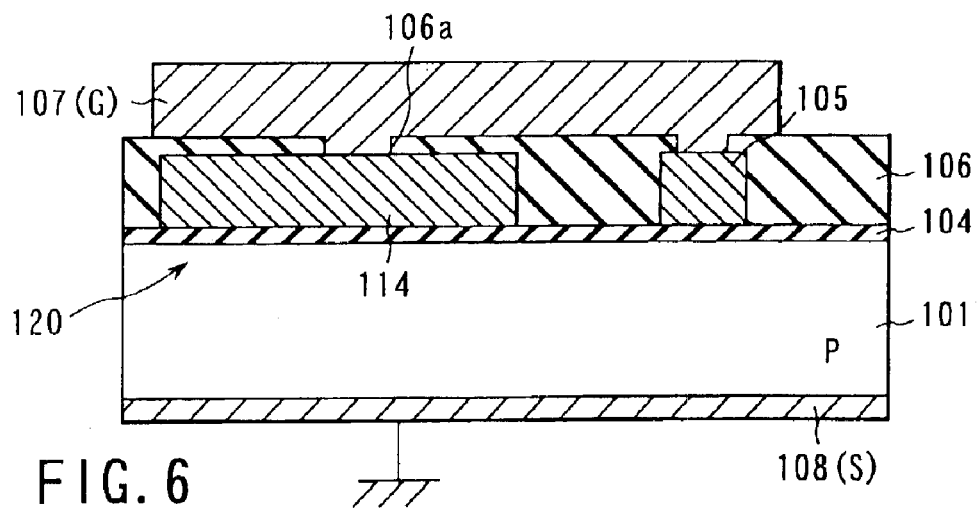
FIG. 6 is a sectional view of another semiconductor device taken along the line III—III in FIG. 1.
Figure 7:
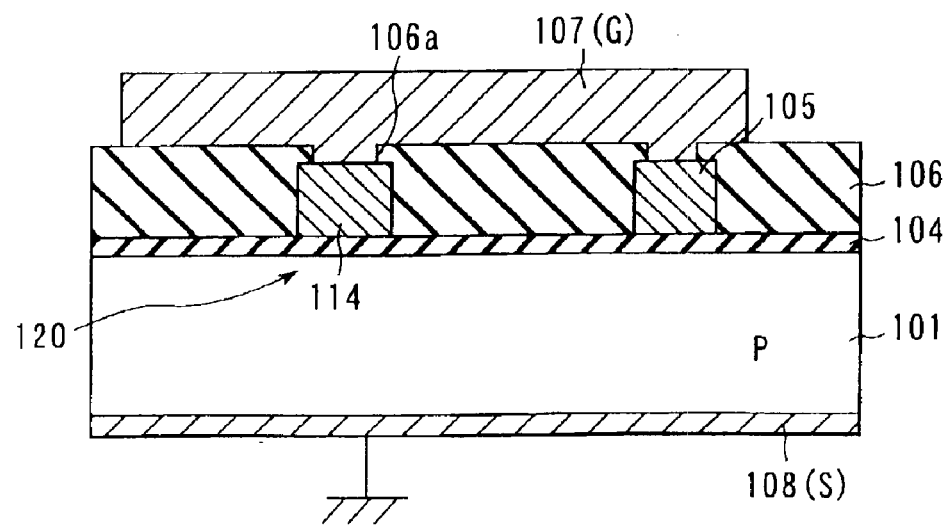
FIG. 7 is a sectional view of still another semiconductor device taken along the line III—III in FIG. 1.

That is, as shown in FIG. 6, the capacitance adjusting electrode 114 is patterned to have a large area to increase the contact area with the gate insulating film 104, thereby increasing the capacitance value of the first capacitor element 120. As shown in FIG. 7, the capacitance adjusting electrode 114 is patterned to have a small area to decrease the contact area with the gate insulating film 104, thereby decreasing the capacitance value of the first capacitor element 120.

Figure 8:
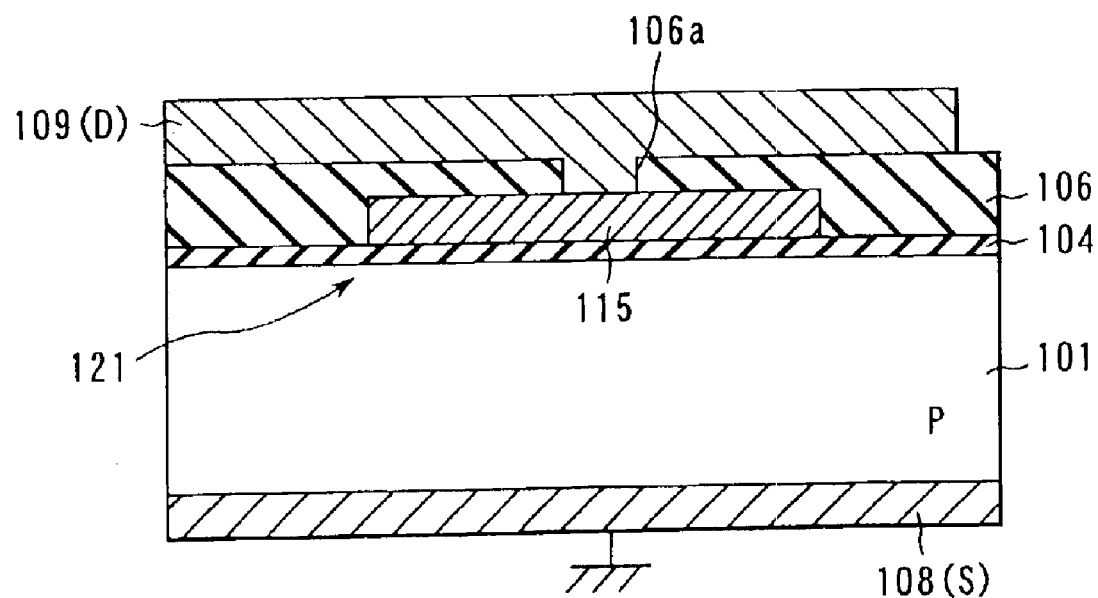
FIG. 8 is a sectional view of still another semiconductor device taken along the line IV—IV in FIG. 1.
Figure 9:
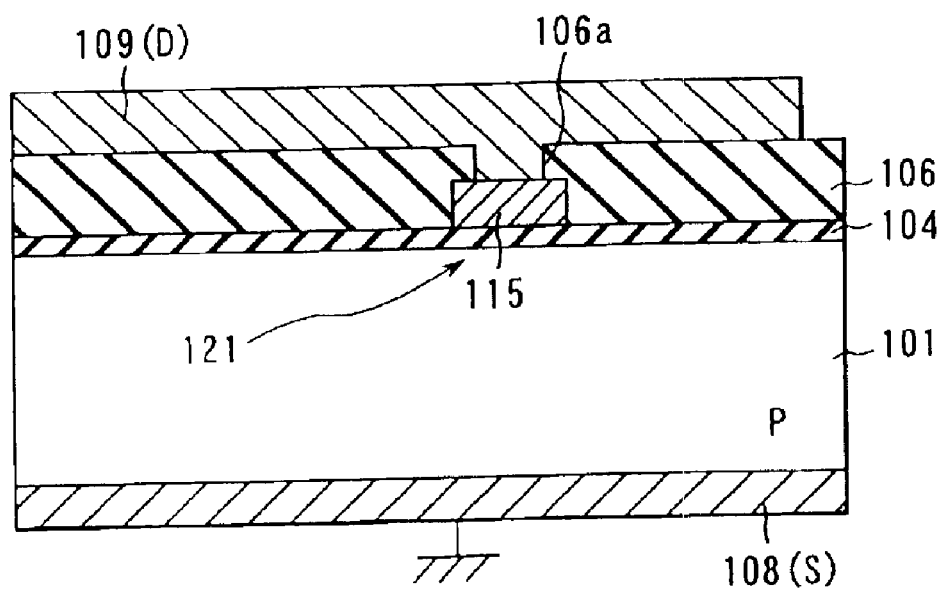
FIG. 9 is a sectional view of still another semiconductor device taken along the line IV—IV in FIG. 1.

Similarly, as shown in FIG. 8, the capacitance adjusting electrode 115 is patterned to have a large area to increase the contact area with the gate insulating film 104, thereby increasing the capacitance value of the second capacitor element 121. As shown in FIG. 9, the capacitance adjusting electrode 115 is patterned to have a small area to decrease the contact area with the gate insulating film 104, thereby decreasing the capacitance value of the second capacitor element 121.

[Second Embodiment]

The second embodiment describes a semiconductor device in which a source electrode is formed on only the upper surface of a semiconductor substrate. This semiconductor device has capacitance adjusting electrodes.

Figure 10:
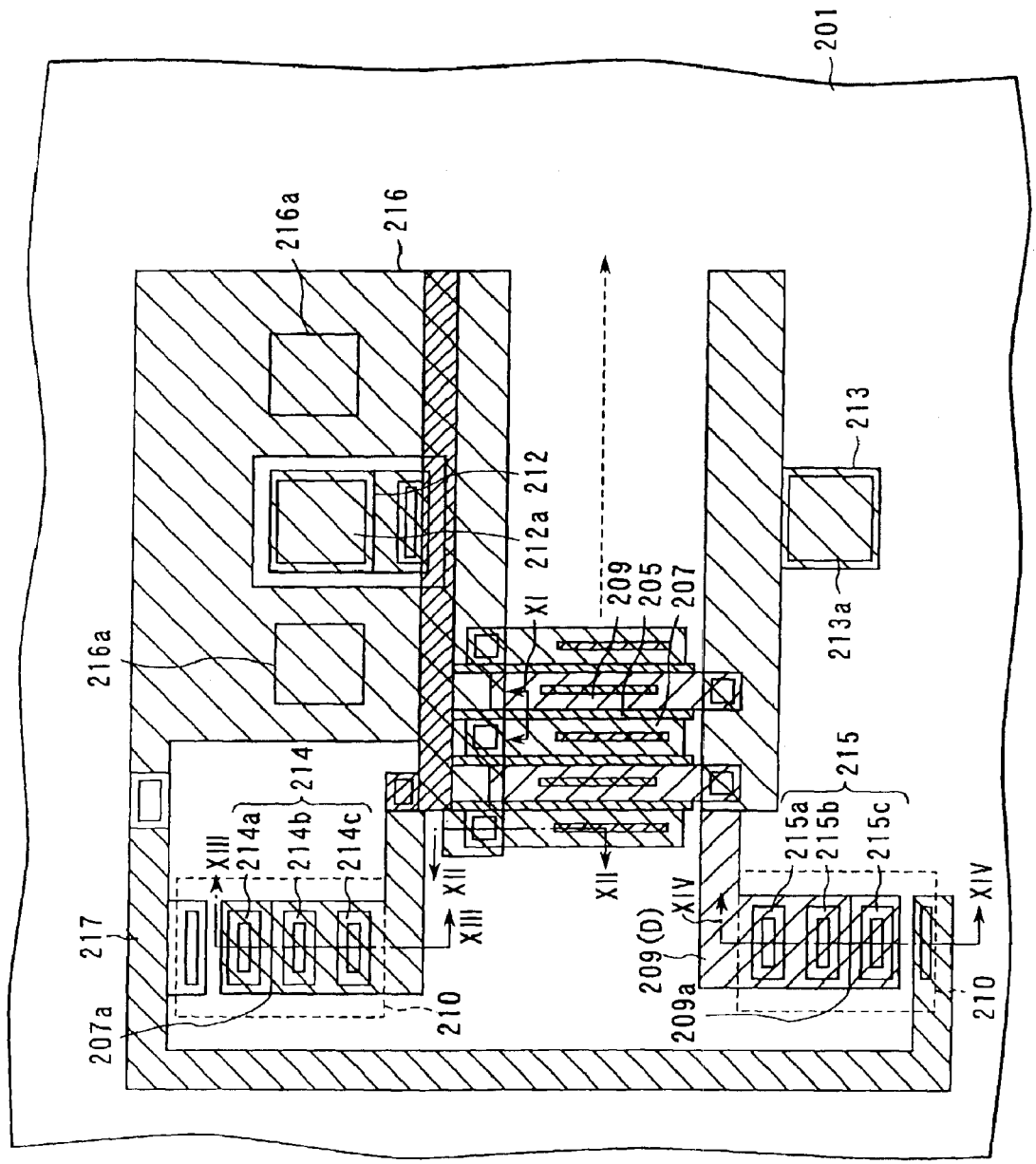
FIG. 10 is a plan view showing a semiconductor device according to a second embodiment of the present invention.
Figure 11:
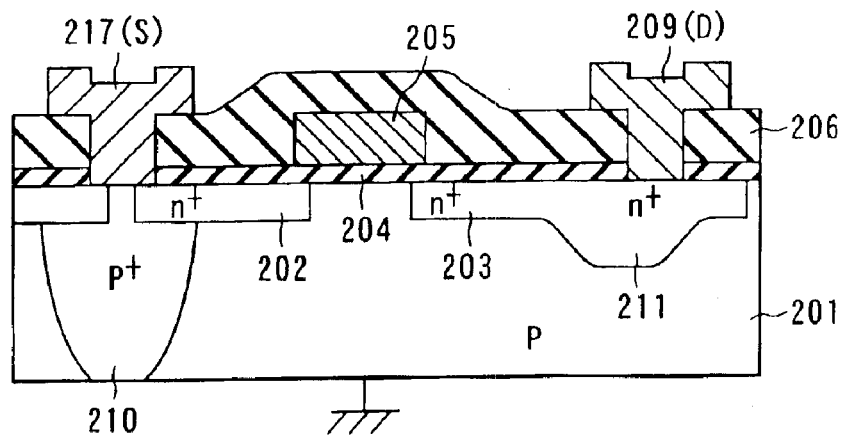
FIG. 11 is a sectional view of the semiconductor device taken along the line XI—XI in FIG. 10.
Figure 12:
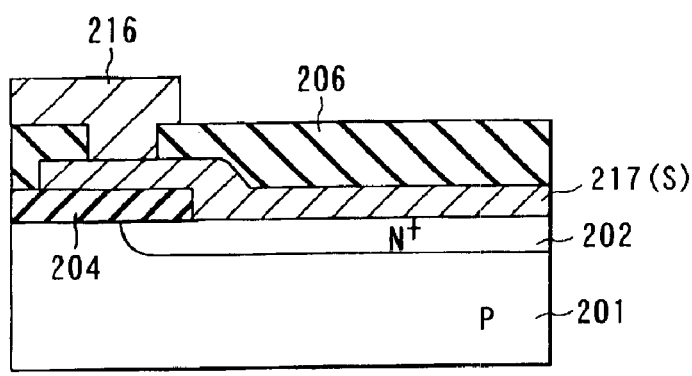
FIG. 12 is a sectional view of the semiconductor device taken along the line XII—XII in FIG. 10.
Figure 13:
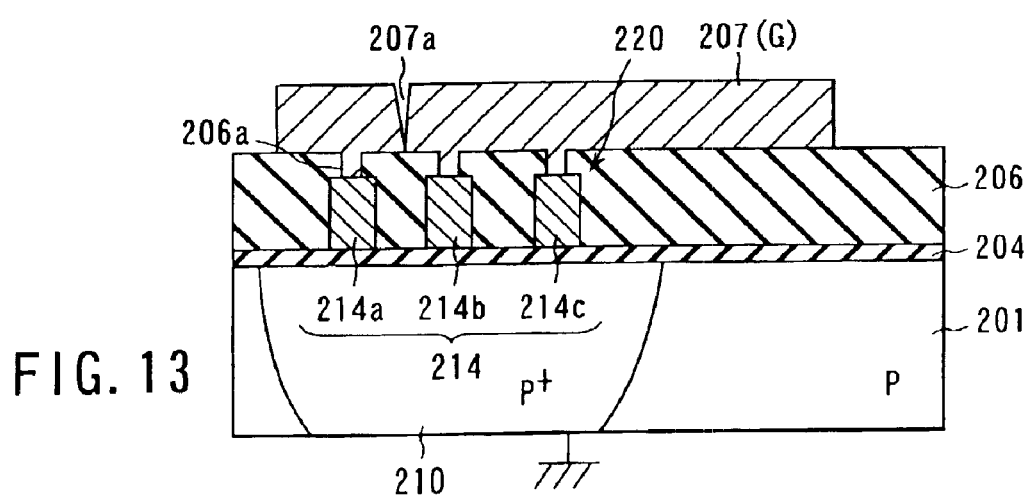
FIG. 13 is a sectional view of the semiconductor device taken along the line XIII—XIII in FIG. 10.
Figure 14:
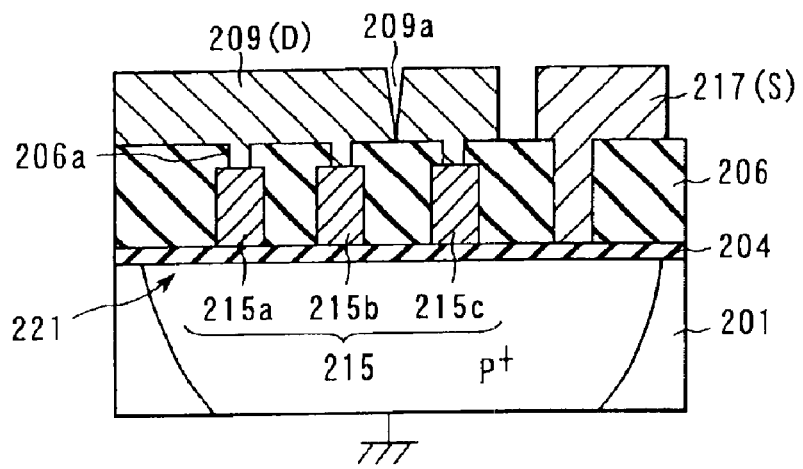
FIG. 14 is a sectional view of the semiconductor device taken along the line XIV—XIV in FIG. 10.

FIG. 10 is a plan view showing a semiconductor device according to a second embodiment of the present invention, FIG. 11 is a sectional view of the semiconductor device taken along the line XI—XI in FIG. 10, FIG. 12 is a sectional view of the semiconductor device taken along the line XII—XII in FIG. 10, FIG. 13 is a sectional view of the semiconductor device taken along the line XIII—XIII in FIG. 10, and FIG. 14 is a sectional view of the semiconductor device taken along the line XIV—XIV in FIG. 10.

A basic structure of the semiconductor device according to the second embodiment of the present invention will be described with reference to FIGS. 10, 11, and 12.

As shown in FIGS. 10, 11, and 12, a p-type semiconductor substrate formed from a silicon semiconductor or the like is grounded. N-type impurity diffusion regions are formed in the upper surface region of the semiconductor substrate 201. A source region 202 and drain region 203 are formed in the respective n-type impurity diffusion regions to oppose each other. In this case, the source region 202 is electrically connected to a $p^+$-type impurity diffusion region 210 while the drain region 203 is formed to be contiguous to an $n^+$-type impurity diffusion region 211. A gate region 205 made of, e.g., polysilicon is formed on a region between the source region 202 and drain region 203 through a gate insulating film 204 formed from, e.g., a silicon thermal oxide film. The gate insulating film 204 and gate region 205 are covered with an insulating film 206 formed from, e.g., a silicon oxide film.

A gate electrode (G) 207 made of, e.g., aluminum, a drain electrodes (D) 209 made of, e.g., aluminum, and a source electrodes (S) 217 made of, e.g., aluminum are formed on the insulating film 206. The gate, drain, and source electrodes 207, 209, and 217 are formed from a first-layer aluminum film (1AL) formed on the semiconductor substrate 201.

The source electrodes 217 are formed immediately above the source region 202 in an element region and at a position two-dimensionally spaced apart from the element region on the upper surface of the semiconductor substrate 201. The source electrode 217 is electrically connected to the source region 202 and $p^+$-type impurity diffusion region 210. A source bonding portion 216 having source pads 216a for connecting to an external circuit is additionally formed on the source electrode 217. The source bonding portion 216 is formed on an element isolation region and formed from a second-layer aluminum film (2AL) formed on the first-layer aluminum film.

The drain electrodes 209 are formed immediately above the drain region 203 in the element region and at a position two-dimensionally spaced apart from the element region on the upper surface of the semiconductor substrate 201. The drain electrode 209 is electrically connected to the drain region 203 and $n^+$-type impurity diffusion region 211. A drain bonding portion 213 having a drain pad 213a for connecting to an external circuit is additionally formed on the drain electrode 209. The drain bonding portion 213 is formed on the element isolation region and formed from the second-layer aluminum film (2AL) formed on the first-layer aluminum film.

The gate electrode 207 is not formed immediately above the gate region 205 in the element region, but formed at a position two-dimensionally spaced apart from the element region on the upper surface of the semiconductor substrate 201. A gate bonding portion 212 having a gate bonding portion 212a for connecting to an external circuit is additionally formed on the gate electrode 207. The gate bonding portion 212 is formed on the element isolation region and formed from the second-layer aluminum film (2AL) formed on the first-layer aluminum film.

A structure as the characteristic feature of the semiconductor device according to the second embodiment of the present invention will be described with reference to FIGS. 10, 13, and 14.

In the second embodiment of the present invention, a first capacitance adjusting electrode 214 close to the gate electrode 207 and a second capacitance adjusting electrode 215 close to the drain electrode 209 are formed on the gate insulating film 204. The first capacitance adjusting electrode 214 forms a first capacitor element 220 having a first capacitance (C1). The second capacitance adjusting electrode 215 forms a second capacitor element 221 having a second capacitance (C2). These first and second capacitance adjusting electrodes 214 and 215 will be described in detail below.

As shown in FIG. 13, the first capacitance adjusting electrode 214 is arranged on the gate insulating film 204. The first capacitance adjusting electrode 214 is comprised of first to third electrodes 214a, 214b, and 214c. An isolation portion 207a is formed in the gate electrode 207, so that the first electrode 214a of the first capacitance adjusting electrode 214 is electrically isolated from the gate electrode 207. Thus, the first capacitor element 220 including the gate insulating film 204, the source region 202 shown in FIG. 11, and the first capacitance adjusting electrode 214 comprised of the second and third electrodes 214b and 214c is formed. Since the first capacitor element 220 is formed by the same method as in the first embodiment, a description thereof will be omitted.

The p$^+$-type impurity diffusion region 210 which reaches the lower surface of the semiconductor substrate 201 is formed immediately under the gate insulating film 204 on which the first capacitance adjusting electrode 214 is formed. In the present invention, it is not necessary to form the impurity diffusion region 210 immediately under the first capacitance adjusting electrode 214.

As shown in FIG. 14, the second capacitance adjusting electrode 215 is arranged on the gate insulating film 204. The second capacitance adjusting electrode 215 is comprised of first to third electrodes 215a, 215b, and 215c. An isolation portion 209a is formed in the drain electrode 209, so that the third electrode 215c of the second capacitance adjusting electrode 215 is electrically isolated from the drain electrode 209. Thus, the second capacitor element 221 including the gate insulating film 204, the drain region 203 shown in FIG. 11, and the second capacitance adjusting electrode 215 comprised of the first and second electrodes 215a and 215b is formed. Since the second capacitor element 221 is formed by the same method as in the first embodiment, a description thereof will be omitted.

The source electrode 217 is connected to the p$^+$-type impurity diffusion region 210. In this case, an n$^+$-type impurity diffusion region can be formed in a contact region between the p$^+$-type impurity diffusion region 210 and the source electrode 217 and a region close to the contact region. The n$^+$-type impurity diffusion region and p$^+$-type impurity diffusion region 210 can make a short circuit to contact the source electrode 217.

The p$^+$-type impurity diffusion region 210 which reaches the lower surface of the semiconductor substrate 201 is formed immediately under the gate insulating film 204 on which the second capacitance adjusting electrode 215 is formed. In the present invention, obviously, the p$^+$-type impurity diffusion region 210 need not be formed immediately under the second capacitance adjusting electrode 215.

The capacitances of the first and second capacitor elements 220 and 221 formed in the above manner may be adjusted by the thickness of the gate insulating film 204. In the second embodiment of the present invention, these capacitances are respectively adjusted by the number of first capacitance adjusting electrodes 214 electrically connected to the gate electrode 207 and the number of second capacitance adjusting electrodes 215 electrically connected to the drain electrode 209.

According to the second embodiment described above, the number of first capacitance adjusting electrodes 214 connected to the gate electrode 207 is changed by adjusting the position of the isolation portion 207a formed in the gate electrode 207, thereby changing the capacitance value C1 of the first capacitor element 220. Similarly, the number of second capacitance adjusting electrodes 215 connected to the drain electrode 209 is changed by adjusting the position of the isolation portion 209a formed in the drain electrode 209, thereby changing the capacitance value C2 of the second capacitor element 221.

In this manner, like the first embodiment, the first and second capacitor elements 220 and 221 having the respective capacitances C1 and C2 are formed, so that the capacitance component of the transistor can be easily adjusted to a predetermined value. This allows to accurately adjust the capacitances and avoid mismatches in matching circuits.

At the same time as formation of the gate region 205, the first and second capacitance adjusting electrodes 214 and 215 can be formed by using the same conductive film as that of the gate region 205. This makes it possible to form the first and second capacitor elements 220 and 221 without any complicated manufacturing process.

Note that a method of adjusting a capacitance of the capacitance adjusting electrode 214 or 215 is not limited to form the isolation portion 207a or 209a in the gate electrode 207 or drain electrode 209. For example, a pattern for the capacitance adjusting electrode 214 or 215 may be changed to change its area.

That is, like the first embodiment, a change in contact area between the gate insulating film 204 and the electrodes 214a, 214b, and 214c of the capacitance adjusting electrode 214 shown in FIG. 13 can adjust the capacitance value of the first capacitor element 220. Similarly, a change in contact area between the gate insulating film 204 and the electrodes 215a, 215b, and 215c of the capacitance adjusting electrode 215 shown in FIG. 14 can adjust the capacitance value of the second capacitor element 221.

Like the first embodiment, when a pattern for the capacitance adjusting electrode 214 or 215 is to be changed to chance its area, the capacitance adjusting electrode 214 or 215 need not be separated into a plurality of electrodes.

Figure 15:
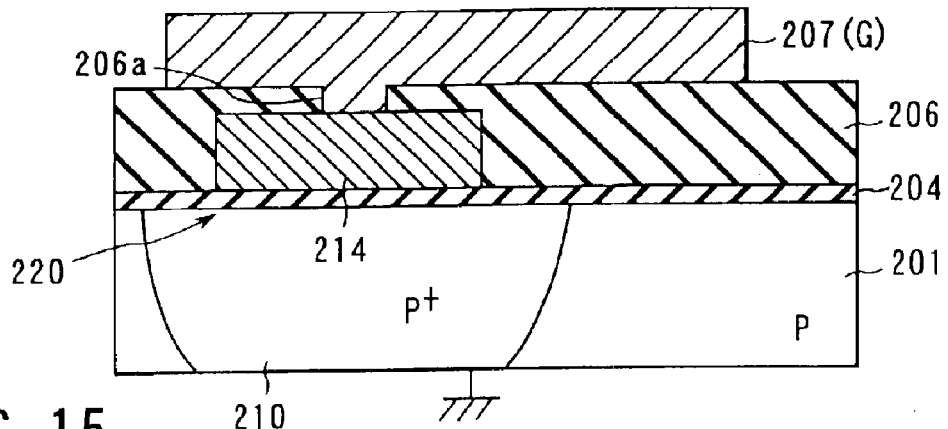
FIG. 15 is a sectional view of another semiconductor device taken along the line XIII—XIII in FIG. 10.
Figure 16:
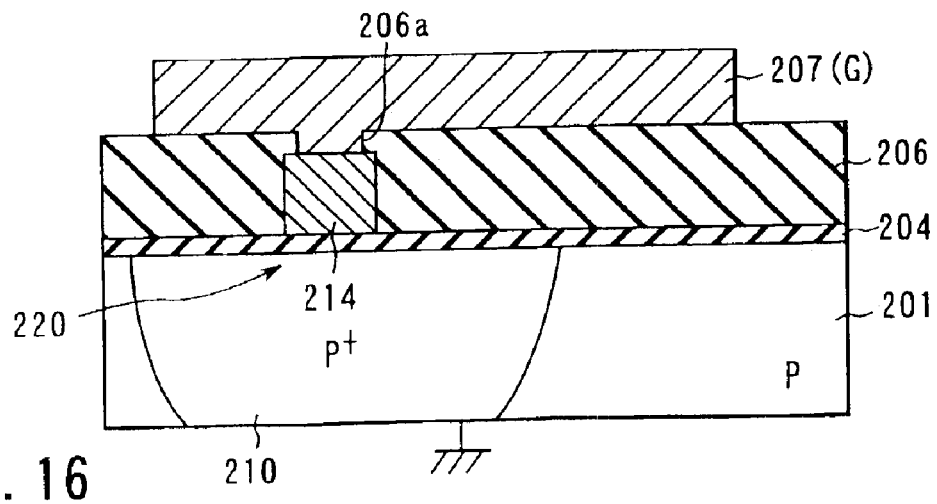
FIG. 16 is a sectional view of still another semiconductor device taken along the line XIII—XIII in FIG. 10.

That is, as shown in FIG. 15, an increase in contact area between the capacitance adjusting electrode 214 and gate insulating film 204 can increase the capacitance value of the first capacitor element 220. As shown in FIG. 16, a decrease in contact area between the capacitance adjusting electrode 214 and gate insulating film 204 can decrease the capacitance value of the first capacitor element 220.

Figure 17:
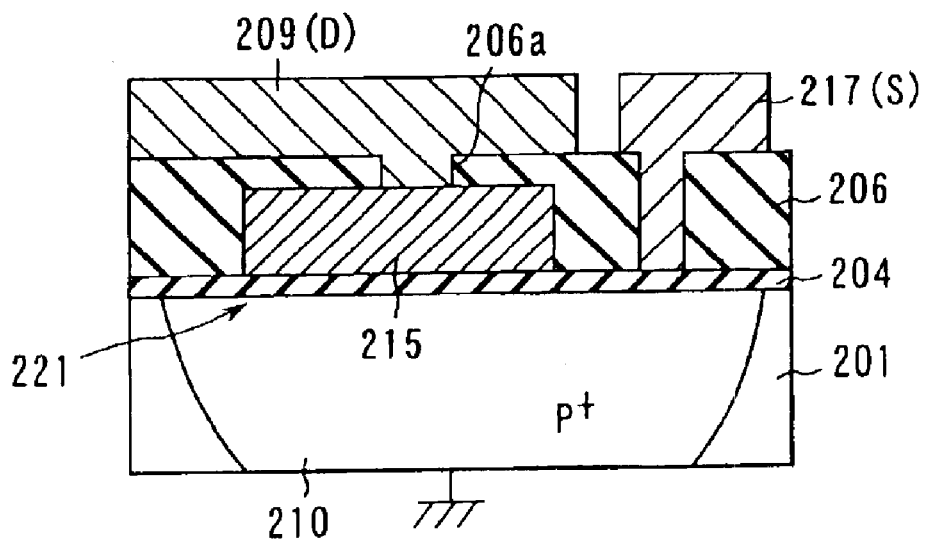
FIG. 17 is a sectional view of still another semiconductor device taken along the line XIV—XIV in FIG. 10.
Figure 18:
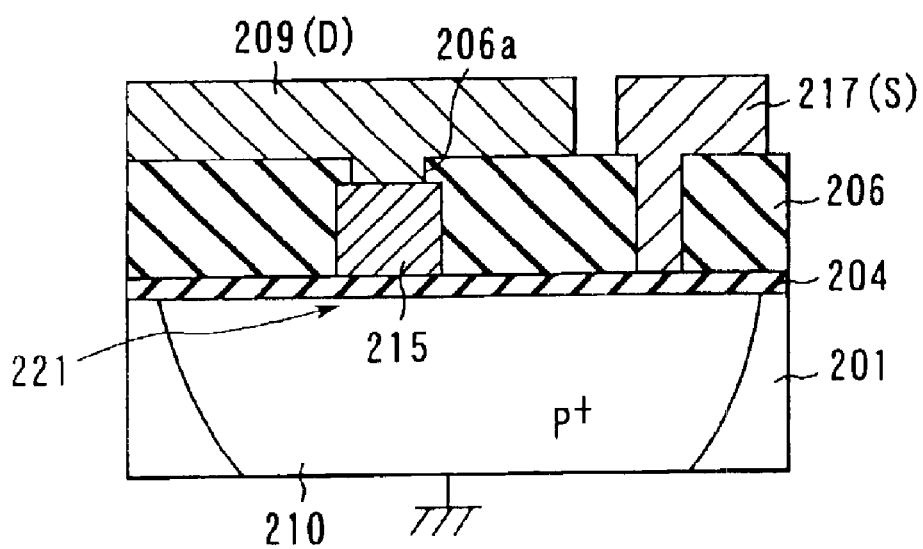
FIG. 18 is a sectional view of still another semiconductor device taken along the line XIV—XIV in FIG. 10.
Figure 19:
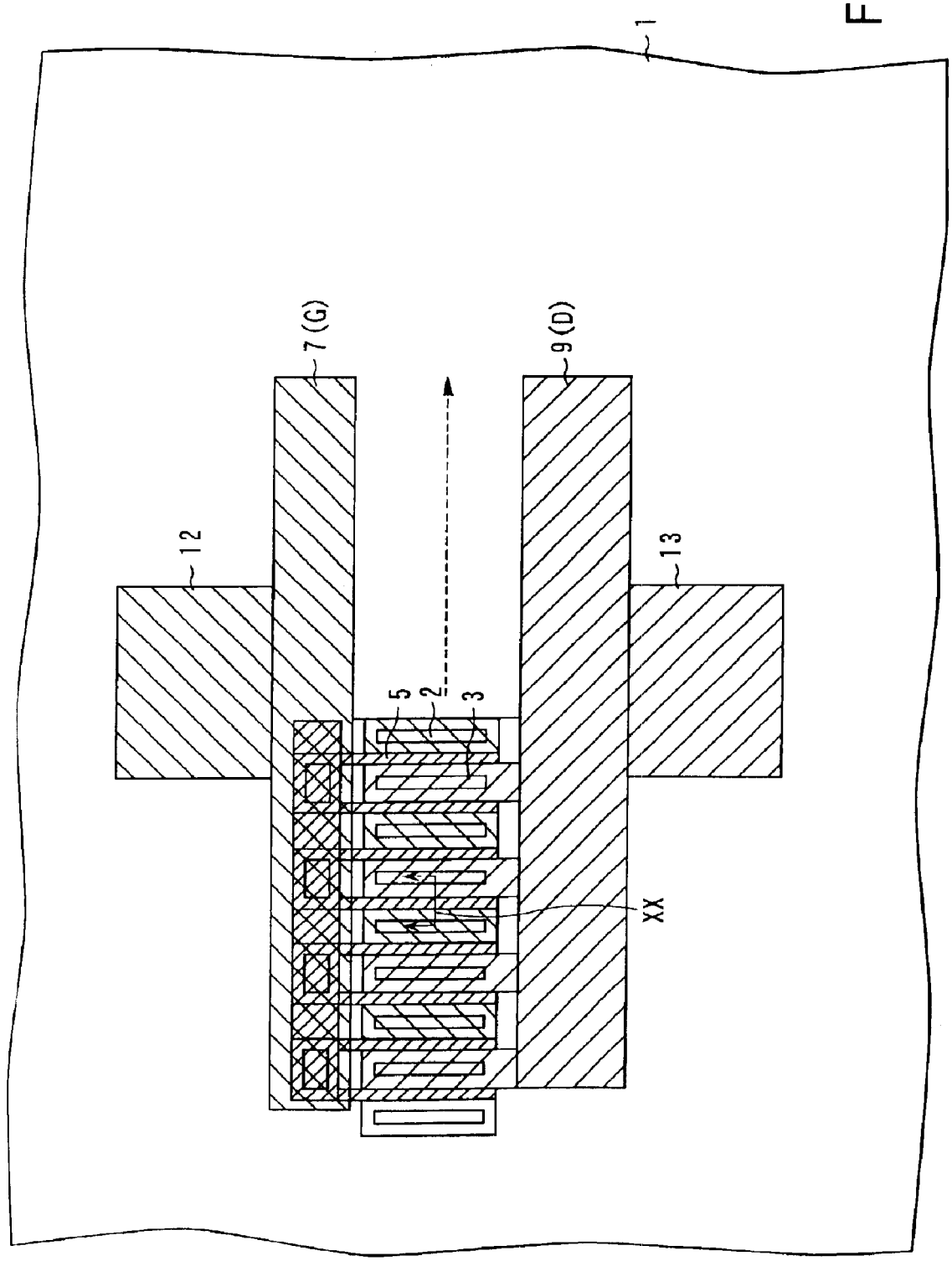
FIG. 19 is a plan view showing a semiconductor device according to a prior art.
Figure 20:
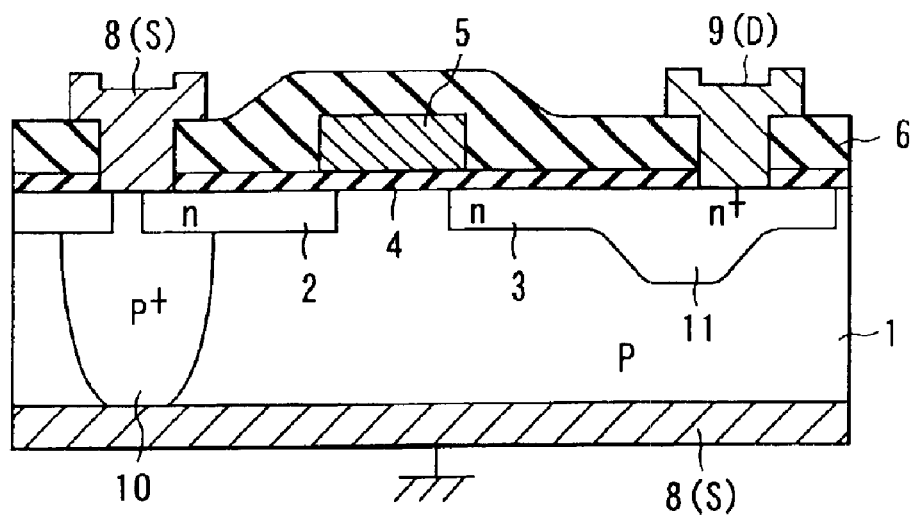
FIG. 20 is a sectional view of the semiconductor device taken along the line of XX—XX.
Figure 21:
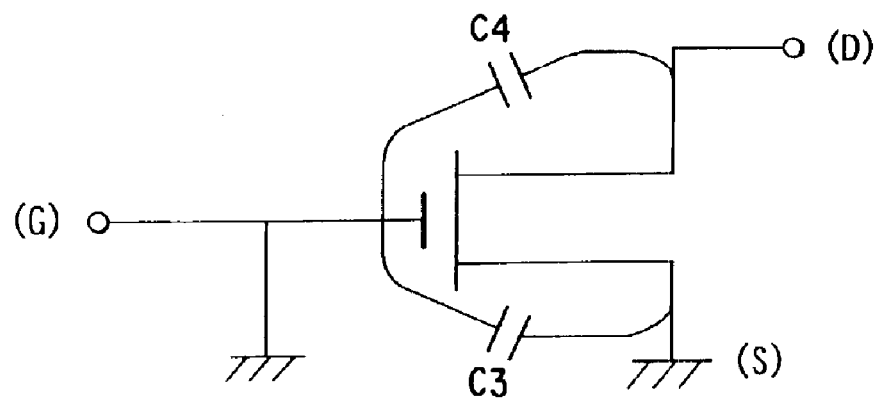
FIG. 21 is a circuit diagram of a MOS transistor shown in FIG. 20.

Similarly, as shown in FIG. 17, an increase in contact area between the capacitance adjusting electrode 215 and gate insulating film 204 can increase the capacitance value of the second capacitor element 221. As shown in FIG. 18, a decrease in contact area between the capacitance adjusting electrode 215 and gate insulating film 204 can decrease the capacitance value of the second capacitor element 221.

According to each of the embodiments of the present invention, each of the embodiments has as its object to provide a semiconductor device capable of realizing a high output by preventing a variation in capacitance component of a semiconductor element without adding any external parts and by suppressing mismatches in input/output matching circuits, and a method of manufacturing the semiconductor device.

Also, in an RF high-output MIS transistor (e.g., a MOSFET), an electrode which adjusts a capacitance is formed on a semiconductor substrate. Also, according to another embodiment of the present invention, a conductive film on which a gate region is formed in gate region formation is patterned to form capacitance adjusting electrodes, and a gate electrode or drain electrode is extended to each capacitance adjusting electrode to be electrically connected thereto. Thereafter, a predetermined number of capacitance adjusting electrodes are disconnected from the gate electrode or drain electrode. With this structure, a variation in capacitance component of the semiconductor element can be accurately adjusted. In addition, the capacitance component of the semiconductor element can be optimized by managing the step in which a capacitance deviation occurs in a process, and on the basis of this management, trimming the electrode or wiring that is the capacitance component so as to optimize it or changing each electrode pattern.

The present invention is not limited to the above embodiments and can be practiced in various modifications without departing from the spirit and scope thereof.

What is claimed is:

1. A semiconductor device comprising:
   a first-conductivity-type semiconductor substrate having a first major surface and a second major surface opposing the first major surface;
   a second-conductivity-type source layer formed in a surface in the semiconductor substrate on a first major surface side;
   a second-conductivity-type drain layer formed in the surface in the semiconductor substrate on the first major surface side to oppose the source layer with a predetermined interval;
   a gate insulating film formed on the first major surface of the semiconductor substrate;
   a gate layer formed on the gate insulating film between the source layer and the drain layer;
   a source electrode formed on the first major surface of the semiconductor substrate and electrically connected to the source layer;
   a drain electrode formed on the first major surface of the semiconductor substrate, electrically connected to the drain layer, and having a second isolation portion;
   a gate electrode formed on the first major surface of the semiconductor substrate, electrically connected to the gate layer, and having a first isolation portion;
   a first capacitance adjusting electrode formed on the gate insulating film, having a first capacitance adjusted by the first isolation portion, and electrically connected to the gate electrode; and
   a second capacitance adjusting electrode formed on the gate insulating film, having a second capacitance adjusted by the second isolation portion, and electrically connected to the drain electrode.

2. A semiconductor device according to claim 1, wherein a plurality of the source electrodes is respectively formed on the first and second major surfaces of the semiconductor substrate.

3. A semiconductor device according to claim 1, wherein each of the first and second capacitance adjusting electrodes is comprised of a plurality of electrodes.

4. A semiconductor device according to claim 3, wherein at least one electrode of the first capacitance adjusting electrode formed of said plurality of electrodes is electrically connected to the gate electrode.

5. A semiconductor device according to claim 3, wherein at least one electrode of the second capacitance adjusting electrode formed of said plurality of electrodes is electrically connected to the drain electrode.

6. A semiconductor device according to claim 1, wherein
   the first capacitance adjusting electrode has a plurality of first electrodes, and the second capacitance adjusting electrode has a plurality of second electrodes,
   at least one of the first electrodes is electrically connected to the gate electrode, and at least one of the second electrodes is electrically connected to the drain electrode.

7. A semiconductor device according to claim 1, wherein the first and second capacitance adjusting electrodes and the gate layer are formed by patterning a single conductive film.

8. A semiconductor device according to claim 1, wherein a first-conductivity-type impurity diffusion layer is formed in the semiconductor substrate under the first and second capacitance adjusting electrodes.

9. A semiconductor device according to claim 1, wherein a first capacitor element including the first capacitance adjusting electrode, the gate insulating film, and the source layer is formed.

10. A semiconductor device according to claim 1, wherein a second capacitor element including the second capacitance adjusting electrode, the gate insulating film, and the drain layer is formed.

11. A semiconductor device according to claim 1, wherein the first isolation portion is a first trench to separate the gate electrode into a first gate portion and a second gate portion,
   the first gate portion is electrically connected to the gate layer, the second gate portion is electrically isolated from the gate layer,
   the second isolation portion is a second trench to separate the drain electrode into a first drain portion and a second drain portion,
   the first drain portion is electrically connected to the drain layer, and the second drain portion is electrically isolated from the drain layer.

12. A semiconductor device comprising:
   a first-conductivity-type semiconductor substrate having a first major surface and a second major surface opposing the first major surface;
   a second-conductivity-type source layer formed in a surface in the semiconductor substrate on a first major surface side;
   a second-conductivity-type drain layer formed in the surface in the semiconductor substrate on the first major surface side to oppose the source layer with a predetermined interval;

a gate insulating film formed on the first major surface of the semiconductor substrate;

a gate layer formed on the gate insulating film between the source layer and the drain layer;

a source electrode formed on the first major surface of the semiconductor substrate and electrically connected to the source layer;

a drain electrode formed on the first major surface of the semiconductor substrate and electrically connected to the drain layer;

a gate electrode formed on the first major surface of the semiconductor substrate, electrically connected to the gate layer, and having a first isolation portion; and a first capacitance adjusting electrode formed on the gate insulating film, having a first capacitance adjusted by the first isolation portion, and electrically connected to the gate electrode.

13. A semiconductor device according to claim 12, wherein the first isolation portion is a first trench to separate the gate electrode into a first gate portion and a second gate portion, the first gate portion is electrically connected to the gate layer, and the second gate portion is electrically isolated from the gate layer.

14. A semiconductor device according to claim 12, wherein a first capacitor element including the first capacitance adjusting electrode, the gate insulating film, and the source layer is formed.

15. A semiconductor device comprising:

a first-conductivity-type semiconductor substrate having a first major surface and a second major surface opposing the first major surface;

a second-conductivity-type source layer formed in a surface in the semiconductor substrate on a first major surface side;

a second-conductivity-type drain layer formed in the surface in the semiconductor substrate on the first major surface side to oppose the source layer with a predetermined interval;

a gate insulating film formed on the first major surface of the semiconductor substrate;

a gate layer formed on the gate insulating film between the source layer and the drain layer;

a source electrode formed on the first major surface of the semiconductor substrate and electrically connected to the source layer;

a drain electrode formed on the first major surface of the semiconductor substrate, electrically connected to the drain layer, and having an isolation portion;

a gate electrode formed on the first major surface of the semiconductor substrate and electrically connected to the gate layer; and a capacitance adjusting electrode formed on the gate insulating film, having a capacitance adjusted by the isolation portion, and electrically connected to the drain electrode.

16. A semiconductor device according to claim 15, wherein the isolation portion comprises a trench to separate the drain electrode into a first drain portion and a second drain portion, the first drain portion is electrically connected to the drain layer, and the second drain portion is electrically isolated from the drain layer.

17. A semiconductor device according to claim 15, wherein a capacitor element including the capacitance adjusting electrode, the gate insulating film, and the drain layer is formed.

* * * * *